(12) United States Patent
Sicard

(10) Patent No.: US 9,893,725 B2
(45) Date of Patent: Feb. 13, 2018

(54) LOW SIDE AND HIGH SIDE DRIVERS FOR A MOTOR

(71) Applicant: Thierry Sicard, Austin, TX (US)

(72) Inventor: Thierry Sicard, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/470,027

(22) Filed: Aug. 27, 2014

(65) Prior Publication Data

US 2016/0065102 A1  Mar. 3, 2016

(51) Int. Cl.
*H01L 25/16* (2006.01)
*H03K 17/18* (2006.01)
*H02P 27/08* (2006.01)

(52) U.S. Cl.
CPC .............. *H03K 17/18* (2013.01); *H02P 27/08* (2013.01); *H03K 2217/0063* (2013.01); *H03K 2217/0072* (2013.01)

(58) Field of Classification Search
CPC ...................... H01L 2924/3011; H01L 29/7397
See application file for complete search history.

(56) References Cited

U.S. PATENT DOCUMENTS

| | | | | |
|---|---|---|---|---|
| 4,371,824 A * | 2/1983 | Gritter | ................ | B60L 11/1803 318/681 |
| 5,375,028 A * | 12/1994 | Fukunaga | ............ | H02H 7/1227 361/31 |
| 2005/0280437 A1 * | 12/2005 | Lewis | ................. | G06F 17/5054 326/38 |
| 2008/0239773 A1 * | 10/2008 | Yang | ................. | H02M 3/33592 363/127 |
| 2011/0110538 A1 * | 5/2011 | Chen | ....................... | H03F 3/187 381/120 |
| 2013/0082741 A1 * | 4/2013 | Domes | ................... | H03K 17/18 327/79 |
| 2013/0332750 A1 * | 12/2013 | Souma | ..................... | H02H 3/08 713/300 |
| 2014/0320178 A1 * | 10/2014 | Hosini | ............ | H03K 17/08128 327/109 |
| 2014/0375575 A1 * | 12/2014 | Kwon | .................. | G06F 3/0412 345/173 |
| 2015/0035508 A1 * | 2/2015 | Kim | ................. | H02M 3/33507 323/282 |

FOREIGN PATENT DOCUMENTS

EP  0467681 A2  1/1992
EP  2444817 B2  10/2013

* cited by examiner

*Primary Examiner* — Eduardo Colon Santana
*Assistant Examiner* — Charles S Laughlin

(57) ABSTRACT

A driver circuit for driving a portion of a motor system is disclosed. The driver circuit may include a current reverse detector operable to detect a current direction associated with the portion of the motor system, an insulated gate bipolar transistor ("IGBT") driver, and an IGBT. The IGBT driver may include: a first input coupled to an output of the current reverse detector and a second input coupled to an operation indication signal.

16 Claims, 4 Drawing Sheets

LOW SIDE AND HIGH SIDE DRIVERS FOR A MOTOR

BACKGROUND

Field

This disclosure relates generally to motor drivers and, more particularly, to low side and high side drivers for a motor.

Related Art

Electric motors continue to be significant and potentially increasingly significant in motors for cars. The ability to optimize performance is becoming thus even more critical. For motors, especially relatively large ones such as those used to power motor vehicles, where control is important often have a low side driver and a high side driver. How the two sides are functioning together can be very significant. Critical to control is access to operating information, especially real time operating information. The convenience of the information can also be significant due to other constraints such as cost and the need to respond to the information very quickly.

Accordingly there is a need to provide further improvement in attaining real time operating information for motors with high side and low side drivers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, each of a low side driver and a high side driver has a current reverse detector that detects when the output current changes direction. This is better understood by reference to the drawings and the following written description.

Figure 1:
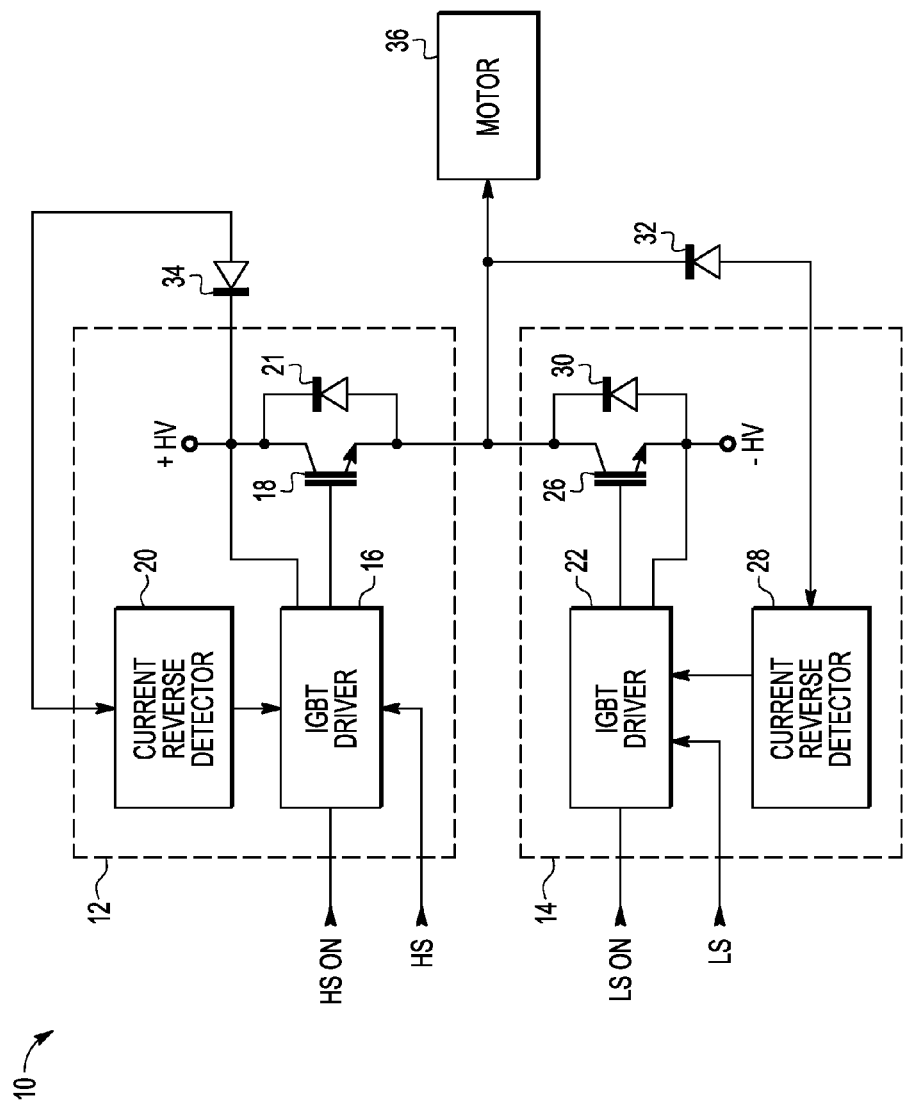
FIG. 1 is a block diagram of a motor coupled to a low side driver and a high side driver having current reverse detectors.

Shown in FIG. 1 is a motor system 10 that includes a high side driver 12 and a low side driver 14 coupled to a motor 36. Motor system 10 further includes a diode 34 and a diode 32. High side driver 12 has a current reverse detector 20, a insulated gate bipolar transistor (IGBT) driver 16, an IGBT 18. and a diode 21. Low side driver 14 has a IGBT driver 22, a current reverse detector 28, an IGBT 26, and a diode 30. Current reverse detector 20 has an input coupled to an anode of diode 34 and an output coupled to a first input of IGBT driver 16. IGBT driver 16 has a second input for receiving a low side on signal LS ON, a third input for receiving a high side signal HS, and an output coupled to a gate of IGBT 18. IGBT driver 16 is also coupled to positive high voltage +HV. IGBT 18, which is an NPN type IGBT, has a collector coupled to a positive high voltage +HV and an emitter coupled to an input of motor 36. Diode 34 has a cathode coupled to positive high voltage +HV. Current reverse detector 28 has an input coupled to an anode of diode 32 and an output coupled to a first input of IGBT driver 22. IGBT driver 22 has a second input for receiving a low side on signal LS ON, a third input for receiving a low side signal LS, and an output coupled to a gate of IGBT 26. IGBT driver is also coupled to negative high voltage −HV. IGBT 26, which is an NPN type IGBT, has an emitter coupled to a negative high voltage −HV and a collector coupled to the input of motor 36. Diode 34 has a cathode coupled to positive high voltage +HV. The term "positive" in positive high voltage +HV means that it is positive in relation to negative high voltage −HV and is not necessarily indicative of a relationship to ground. Similarly, "negative" in negative high voltage −HV means that it is negative in relation to positive high voltage +HV and is not necessarily indicative of a relationship to ground.

Figure 2:
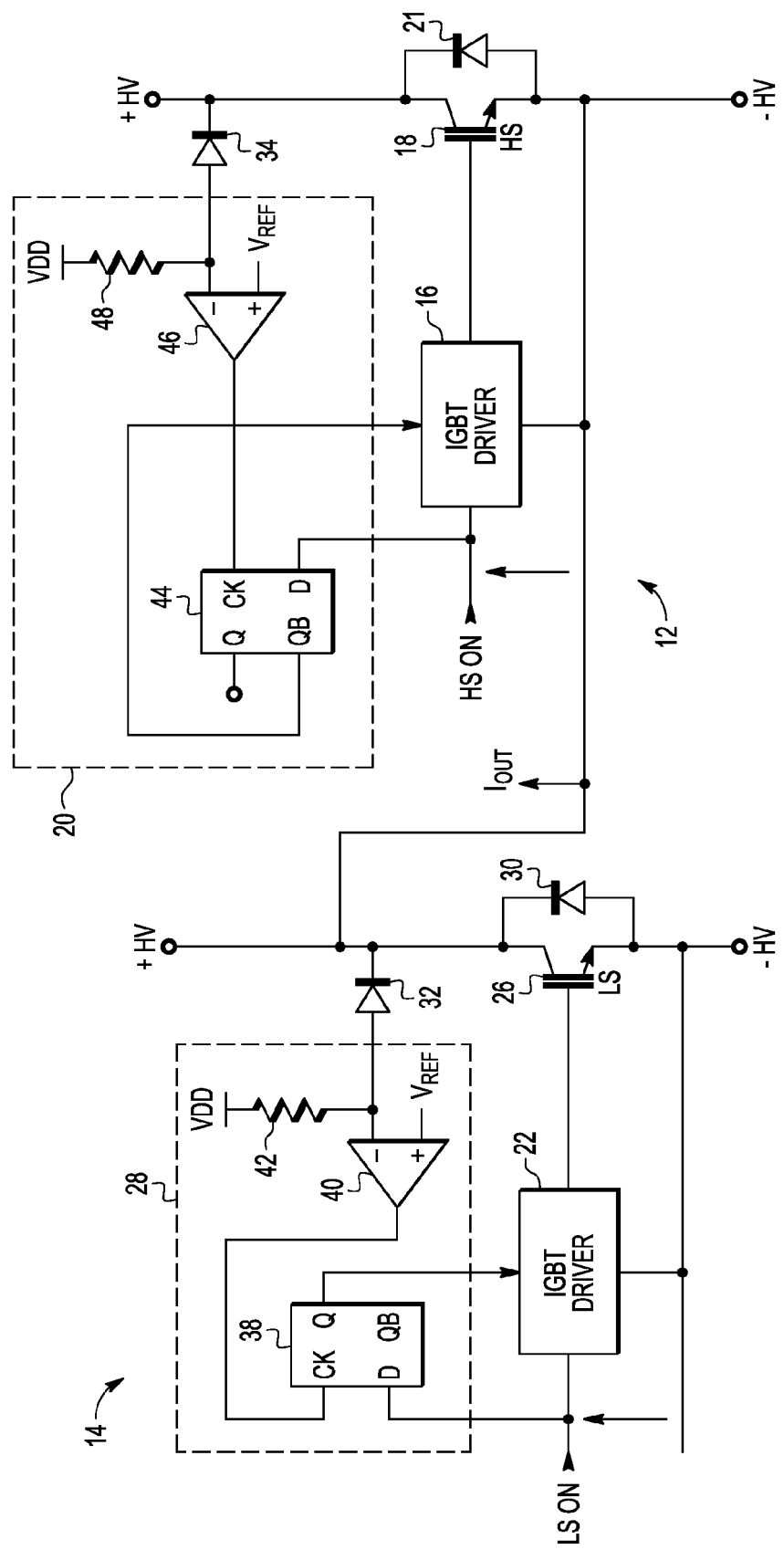
FIG. 2 is a more detailed diagram of the low side driver and high side driver of FIG. 1.

Shown in FIG. 2 are high side driver 12 and low side driver 14 showing more detail of current reverse detectors 20 and 28. Current reverse detector 20 has a D flip-flop 44, a comparator 46, and a resistor 48. D flip-flop 44 has a clock input coupled to an output of comparator 46, an input D for receiving high side on signal HS ON, a true output Q that is not necessarily used, and a complementary output QB coupled to the first input of IGBT driver 16. Resistor 48 has a first terminal coupled to a positive power supply voltage VDD and a second terminal coupled to the anode of diode 34 and to a non-inverting input of comparator 46. Comparator 46 has an inverting input coupled to a reference voltage Vref. Current reverse detector 28 has a D flip-flop 38, a comparator 40, and a resistor 42. D flip-flop 38 has a clock input coupled to an output of comparator 40, an input D for receiving low side on signal LS ON, a complementary output QB that is not necessarily used, and a true output Q coupled to the first input of IGBT driver 22. Resistor 42 has a first terminal coupled to positive power supply voltage VDD and a second terminal coupled to the anode of diode 32 and to a non-inverting input of comparator 40. Comparator 40 has an inverting input coupled to reference voltage Vref.

Figure 3:
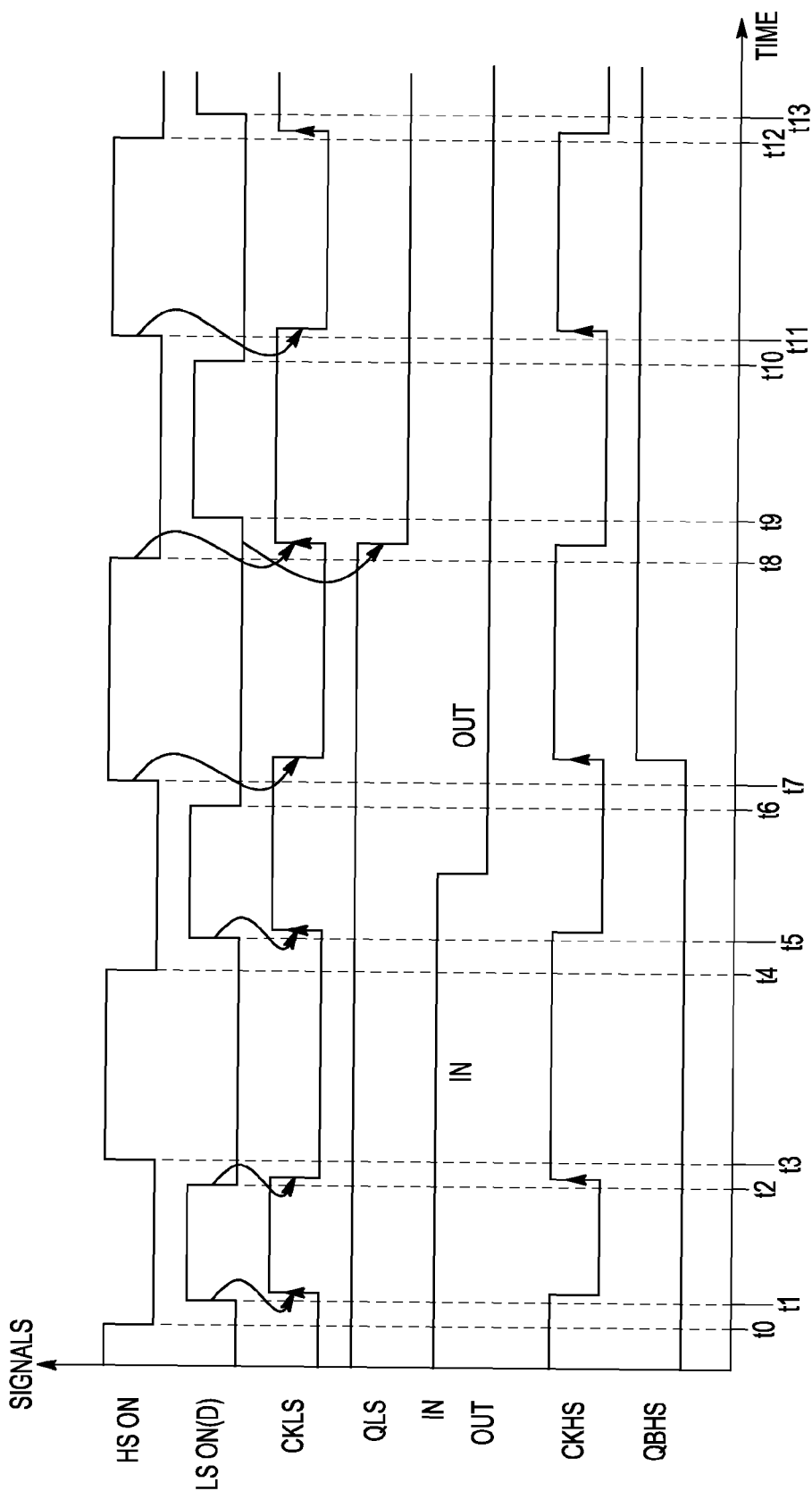
FIG. 3 is a timing diagram useful in understanding the operation of the low side driver and high side driver of FIG. 1.

Shown in FIG. 3 is a timing diagram showing that the current direction is "out" from a t0 until after time 5 and is "in" from before time 6 and continues in for the remainder of the span of the timing diagram which extends past time t14. The transition from out to in occurs between time t5 and time t6. Signal Q low side (QLS), which is the Q output of D flip-flop 38, is from low side driver 14, and more particularly from current reverse detector 28, and indicates the current reverse at time t8 with a logic low to logic high transition. Signal QB high side (QBHS), which is the QB output of D flip-flop 44, is from high side driver 12, and more particularly from current reverse detector 20, and indicates the current reverse just after time t7 with a logic high to logic low transition. The timing diagram is for a couple of cycles before and after the current transition from in to out. Out is considered to be current flowing in the direction toward the motor. In is considered to be in the direction away from the motor and toward the common node between the high and low drivers.

Starting a time t0, high side on signal HSON is a logic high, low side on signal LSON is a logic low, low side clock CKLS is a logic low, out of D flip-flop 38 (QLS) is a logic high, the direction (IO DIR) of the current IOUT is in, high side clock CKHS is a logic high, and output QBHS is a logic low. The current direction being in indicates that current is either flowing through IGBT 26 to −HV or through diode 21 to positive high voltage +HV. With HSON at a logic low, IGBT 26 is nonconductive so that the current is flowing through diode 21. With current flowing through diode 21, the voltage at IOUT is sufficiently high to be considered a logic high which results in inverting input of comparator 40 being a logic high at a higher voltage than reference voltage Vref. The output of comparator 40, clock CKLS, is thus a logic low. Input D of flip-flop 38 receives low side on signal LSON. With current flowing through diode 21, there is very little voltage difference between the voltage at IOUT and power supply terminal +HV. The result is that the inverting input of comparator 46 is a logic low and below reference Vref so that comparator 46 provides a logic high and thus clock CKHS is a logic high.

At time t1, low side on signal LSON becomes active which causes IGBT driver 22 to enable IGBT 26, with the current being in, causing it to draw current from Iout. This in turn causes the inverting input of comparator 40 to switch to a logic low with IGBT 26 being conductive, thus causing the clock input, CKLS, to D flip-flop 38 to switch to a logic high causing the outputs Q and QB of D flip-flop 38 to update based on the logic state of input D, which is a logic high because LSON has switched to a logic high. The logic high output of D flip-flop 38, QLS, indicates that the state of the current flow is in. With HSON at a logic low, IGBT is non-conductive so that the inverting input of a comparator is a logic high so that CKHS is a logic low and D flip-flop 44 does not update. Output QBHS stays at a logic low.

At time t2, LSON switches back to a logic low causing IGBT to become non-conductive. With the current flowing being in, current begins flowing through diode 21 causing the inverting input of comparator 40 to become a logic high thus causing comparator 40 to output a logic low to the clock input, CKLS, of D flip-flop 38. The input D of flip-flop 38 has switched from a logic high to a logic low. The outputs of D flip-flop 38 remain unchanged. A very short time after low side on signal LSON has switched to a logic low, high side on signal HS switches to a logic but IGBT remains non-conductive because the current direction is in and diode 21 is forward biasing and conducting current. Thus the voltage at Iout is a diode drop above the voltage of high voltage +HV and keeps IGBT 18 from being conductive. Accordingly the inverting input of comparator 46 remains unchanged at a logic high. So long as IGBT remains non-conductive, the inverting input of comparator will remain at a logic high and thus outputs Q and QB of D flip-flop 44 will remain unchanged. In particular, output QB will remain a logic low at time t3 after high side on HSON has switched to a logic high.

At time t4, high side on signal HSON switches to a logic low which reduces the gate voltage of IGBT 18. IGBT 18 remains non-conductive and so the inverting input of comparator 46 remains unchanged. The outputs Q and QB of D flip-flop 44 remain unchanged thus indicating to IBGT driver 16 that the current direction may not have changed. At time t5 low side on signal LSON switches to a logic low causing IGBT to become conductive causing the voltage on Iout to decrease sufficiently to cause the inverting input of comparator 40 to switch to a logic high and thereby causing CKLS to switch to a logic low. Thus the outputs Q and QB of flip-flop do not update. Output QLS remains a logic high indicating to IGBT driver 22 that the current direction may not have changed.

At time t6 low side on signal LSON switches to a logic low. In this example, the current direction switches from in to out between time t5 and t6. With current flowing out, the voltage on output Iout is a diode drop below negative high voltage −HV. The result is that the logic state read by the inverting input of comparator 40 remains a logic low. IGBT 18 remains non-conductive with high side on signal HSON still a logic low. When low side on signal LSON switches to a logic low at time t6, the input to the gate of IGBT 26 is a logic low but does not affect the voltage of output Iout due to the current direction now being out.

At time t7, high side on signal HSON switches to a logic high which causes IGBT 18 to become conductive and thus increasing the voltage on Iout sufficiently to cause the logic state of the inverting input of comparator 40 to switch to a logic high. Comparator 40 then provides a logic low output to D flip-flop 38 as CKLS. With IGBT 18 conductive, the inverting input of comparator 46 becomes a logic low which causes comparator 46 to provide a logic high to D flip-flop 44 as shown in FIG. 3 with CKHS switching to a logic high. The D input is a logic high with high side on signal HSON being a logic high. Thus output QBHS is output as a logic high to IBGT driver 16 to indicate that the current direction has reversed. Thus, IGBT driver 16 has the information that the current direction has changed in response to the high side on signal HSON switching to a logic low for the first time after the current direction change.

At time t8, high side on signal HSON switches to a logic low which causes IGBT 18 to become non-conductive and current to flow out through diode 30 so that the voltage of Iout is one diode drop below negative high voltage −HV, thereby causing the logic state of the inverting input of comparator 40 to be a logic low. The logic low on the inverting input causes comparator 40 to output a logic high as clock CKLS. At this point, low side on signal LSON is still a logic low so that the outputs of D flip-flop 38 switch states and, in particular, output QLS switches to a logic low. Output QLS at a logic low informs IBGT driver 22 that the current direction has changed; in this case from in to out. At time t9, low side on signal LSON switches to a logic high and applied to the gate of IGBT 26. This has no effect on the voltage at Iout due to the current direction now being out. Thus, there is no change on the inverting input of comparator 40. Similarly there is no change on the inverting input of comparator 46.

At time t10, low side signal LSON switches to a logic low which is applied to the gate of IGBT 26 this also has no effect on Iout. At time t11, high side signal HSON switches to a logic high causing transistor IGBT to become conductive and begin supplying the out current on Iout. This causes the input of the inverting input of comparator 46 to switch to a logic low which results in clock CKHS switching to a logic high. At this point, input D is a logic high because high side signal HSON is a logic high. Thus output QBHS remains a logic high. Thus, even though the inverting input of comparator 46 changes in response to high side on signal HSON switching to a logic low, the state of output signal QBHS does not change if there is no change in current direction. In the out direction for the current, the inverting input of comparator 40 does not change so that output QLS does not change in the out direction of the current. Both QLS and QBHS change only when there has been a change in direction of the current.

This information as to a change in current can be used locally, that is within the IGBT and the IGBT driver to, for example, reduce power by controlling the switching of the IGBT that is not in use. For example, reducing the on/off cycles of IGBT 26 during the time the current direction is out.

Figure 4:
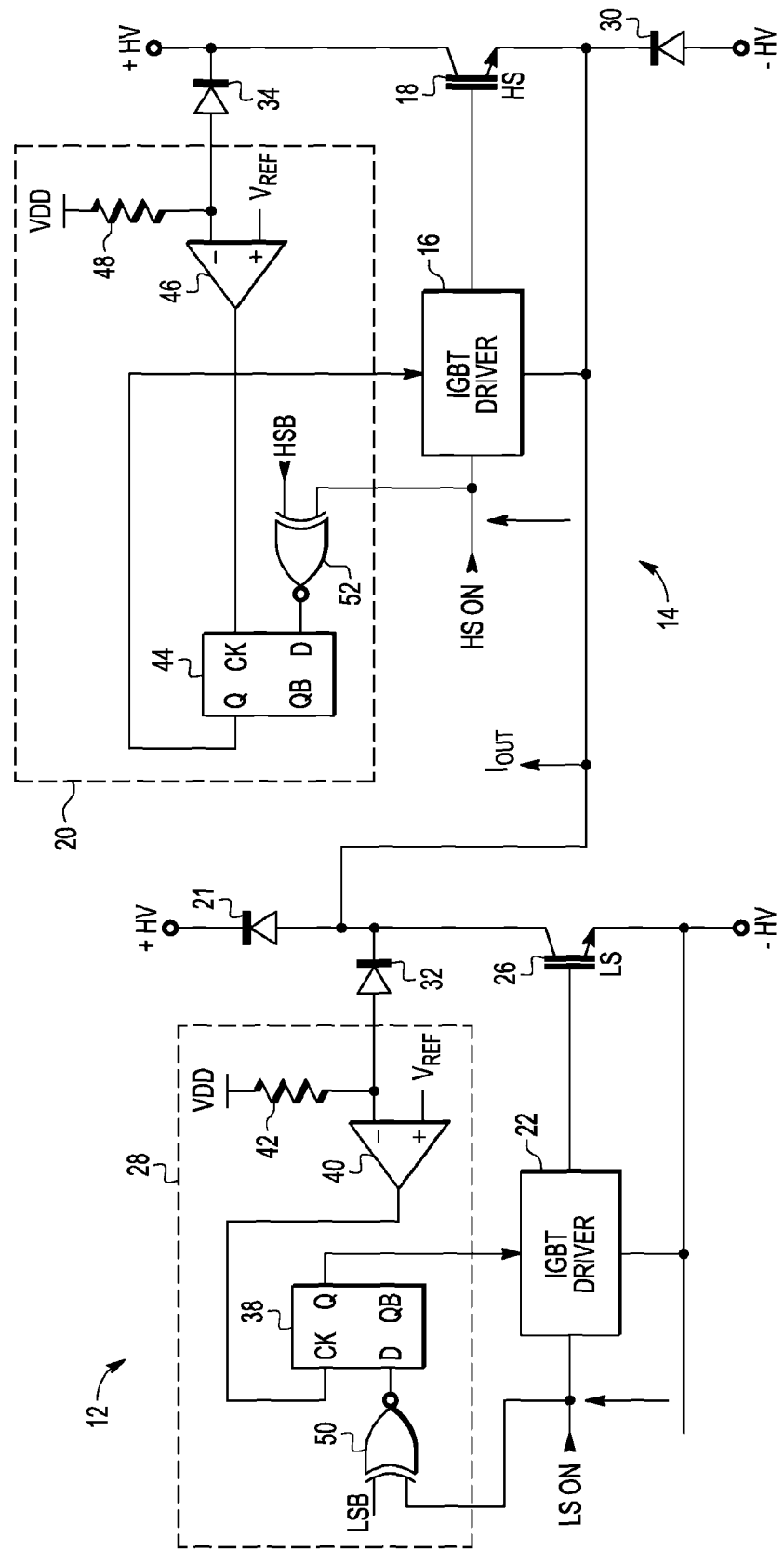
FIG. 4 is a circuit diagram of a low side driver and a high side driver having current reverse detectors as a variation to that shown in FIG. 2.

Shown in FIG. 4 is a variation for the D input to D flip-flops 38 and 44. Instead of the D input for D flip-flop 38 being directly connected to low side on signal LSON, an exclusive NOR gate 50 is used. Exclusive NOR gate 50 has a first input for receiving low side on signal LSON, a second input for receiving a complementary low side signal LSB, and an output coupled to the D input of D flip-flop 38. Similarly, instead of the D input for D flip-flop 44 being directly connected to high side on signal HSON, an exclusive NOR gate 52 is used. Exclusive NOR gate 52 has a first input for receiving high side on signal HSON, a second input for receiving a complementary high side signal HSB, and an output coupled to the D input of D flip-flop 44. In this case, when the two inputs to the exclusive NOR gate become the same logic state, the output of the Exclusive NOR gate switches to a logic high. Comparators 40 and 46 function the same as in FIG. 2. A difference is that the non-inverting output of the flip-flops indicates the direction of the current for both in and out. For high side driver 12, the signal HSB is equal to 0. The exclusive NOR function provides OUT=HSON_not, when HSB=0. This means that at each rising clock the D flip-flop will latch the data D, which is the inverse of the HSON signal. By doing this, the Q and QB information will be reversed, so the Q output will nr usable even for high side driver 12. Thus, the design is the same for the high side and low side circuits. The result is the same circuit design for both the low side and high side drivers 14 and 12, respectively. In low side driver 14, signal LSB=1, so the output of exclusive NOR gate 50 will give OUT=LSON, which is no inversion. In such case the result is as if xNOR gate 50 was not there.

Thus it is shown that a circuit in close proximity to the IBGT controller can identify when a current direction change has a occurred. The IBGT controller can then use that information to provide improved performance at least under some circumstances.

By now it is apparent that there has been described a driver circuit for driving a portion of a motor system. The driver circuit includes a current reverse detector operable to detect a current direction associated with the portion of the motor system. The driver circuit further includes an insulated gate bipolar transistor ("IGBT") driver including a first input coupled to an output of the current reverse detector and a second input coupled to an operation indication signal. The driver circuit further includes a control electrode coupled to an output of the IGBT driver, a first current electrode coupled to a first voltage supply, and a second current electrode coupled to an input of the motor system. The driver circuit may have a further characterization by which the driver circuit comprises a high-side driver circuit for the portion of the motor system, and wherein the operation indication signal comprises a high-side on signal. The driver circuit may have a further characterization by which the driver circuit comprises a low-side driver circuit for the portion of the motor system, and wherein the operation indication signal comprises a low-side on signal. The driver circuit may further include a diode coupled between the first and second current electrodes of the IGBT. The driver circuit may further include a diode having a cathode coupled to the first current electrode of the IGBT and an anode coupled to an input of the current reverse detector. The driver circuit may have further include a diode having a cathode coupled to the second current electrode of the IGBT and an anode coupled to an input of the current reverse detector. The driver circuit may have a further characterization by which the current reverse detector includes a comparator which includes a first input coupled to a second voltage source and a second input coupled to a reference voltage source and a flip-flop, which includes a first input coupled to an output of the comparator, a second input coupled to the operation indication signal, and an output coupled to the output of the current reverse detector. The driver circuit may have a further characterization by which the current reverse detector further comprises a resistive element coupled between the first input of the comparator and the second voltage source. The driver circuit may have a further characterization by which the current reverse detector includes a comparator, which has a first input coupled to a second voltage source and a second input coupled to a reference voltage source, and a flip-flop, which has a first input coupled to an output of the comparator, a second input coupled to a logic circuit operable to provide a logic level associated with the operation indication signal, and an output coupled to the output of the current reverse detector. The driver circuit may have a further characterization by which the logic circuit comprises an exclusive NOR gate comprising: a first input coupled to the operation indication signal; and a second input coupled to a complementary input signal.

Also described is a driver circuit for driving a portion of a motor system. The driver circuit includes a high side driver and a low side driver. The high side driver includes a first current reverse detector, a first insulated gate bipolar transistor ("IGBT") driver having a first input coupled to an output of the first current reverse detector and a second input coupled to a first operation indication signal, and a first IGBT having a control electrode coupled to an output of the first IGBT driver, a first current electrode coupled to a first voltage supply, and a second current electrode coupled to an input of a motor. The low-side driver includes a second current reverse detector, a second insulated gate bipolar transistor ("IGBT") driver having a first input coupled to an output of the second current reverse detector and a second input coupled to a second operation indication signal, and a second IGBT having a control electrode coupled to an output of the second IGBT driver, a first current electrode coupled to a second voltage supply and a second current electrode coupled to the input of a motor. The driver circuit may further include a diode coupled between the current electrodes of the first IGBT. The driver circuit may further include a diode coupled between the current electrodes of the second IGBT. The driver circuit may further include a diode having a cathode coupled to the first current electrode of the first IGBT and an anode coupled to an input of the first current reverse detector. The driver circuit may further include a diode having a cathode coupled to the second current electrode of the second IGBT and an anode coupled to an input of the second current reverse detector. The driver circuit may have a further characterization by which the first current reverse detector includes a comparator and a flip-flop in which the comparator has a first input coupled to a third voltage source and a second input coupled to a reference voltage source and the flip-flop has a first input coupled to an output of the comparator, a second input coupled to the first operation indication signal, and an output coupled to the output of the current reverse detector. The driver circuit may have a further characterization by which the second current reverse detector has a comparator and a flip-flop in which the comparator has a first input coupled to a third voltage source and a second input coupled to a reference voltage source and the flip-flop has a first input coupled to an output of the comparator, a second input coupled to the second operation indication signal, and an output coupled to the output of the second current reverse detector. The driver circuit may have a further characterization by which the first and second current reverse detectors each include a comparator and a flip-flop in which the comparator has a first input coupled to a third voltage source and a second input coupled to a reference voltage source and the flip-flop has a first input coupled to an output of the comparator, a second input coupled to a logic circuit operable to provide a logic level associated with the operation indication signal, and an output coupled to the output of the current reverse detector. The driver circuit may have a further characterization by which the logic circuit comprises an exclusive NOR gate comprising: a first input coupled to the operation indication signal; and a second input coupled to a complementary input signal. The driver circuit may have a further characterization by which each current reverse detector further comprises a resistive element coupled between the first input of the comparator and the third voltage source.

Although the invention is described herein with reference to specific embodiments, various modifications and changes can be made without departing from the scope of the present invention as set forth in the claims below. For example, a D flip-flop was described but other functional logic may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A driver circuit for driving a portion of a motor system, the driver circuit comprising:
a current reverse detector operable to detect a current direction associated with the portion of the motor system, the current reverse detector comprising a flip-flop logic circuit and a comparator comprising a first input coupled to a voltage source;
an insulated gate bipolar transistor ("IGBT") driver comprising:
a first input coupled to an output of the current reverse detector; and
a second input coupled to an operation indication signal;
an IGBT comprising:
a control electrode coupled to an output of the IGBT driver;
a first current electrode coupled to an input of the motor system; and
a second current electrode coupled to a first voltage supply and to an input of the current reverse detector, wherein the current reverse detector detects the current direction by comparing a first voltage with a reference voltage, the first voltage being relative to a voltage across the first and second current electrodes, and wherein the IGBT driver is connected to the second current electrode;
a first diode having a cathode coupled to the second current electrode of the IGBT and an anode coupled to the first current electrode of the IGBT; and
a second diode having a cathode coupled to the second current electrode of the IGBT and an anode connected to the first input of the comparator of the current reverse detector to provide a current direction indication to the IGBT driver from the current reverse detector, and the anode not connected to the first current electrode of the IGBT.

2. The driver circuit of claim 1, wherein the driver circuit comprises a high-side driver circuit for the portion of the motor system, and wherein the operation indication signal comprises a high-side on signal.

3. The driver circuit of claim 1, wherein the first current electrode is characterized as an emitter and the second current electrode is characterized as a collector.

4. The driver circuit of claim 1, wherein the current reverse detector comprises
a flip-flop comprising:
a first input coupled to an output of the comparator;
a second input coupled to the operation indication signal; and
an output coupled to the output of the current reverse detector, and
the comparator comprises a second input coupled to a reference voltage source, the reference voltage source providing the reference voltage.

5. The driver circuit of claim 4, wherein the current reverse detector further comprises a resistive element coupled between the first input of the comparator and the voltage source.

6. The driver circuit of claim 4, wherein the
second input of the flip-flop is coupled to a logic circuit operable to provide a logic level associated with the operation indication signal.

7. The driver circuit of claim 6, wherein the logic circuit comprises an exclusive NOR gate comprising: a first input coupled to the operation indication signal; and a second input coupled to a complementary input signal.

8. A driver circuit for driving a portion of a motor system, the driver circuit comprising:
a high-side driver comprising:
a first current reverse detector comprising a flip-flop logic circuit and a first comparator comprising a first input coupled to a voltage source;
a first insulated gate bipolar transistor ("IGBT") driver comprising:
a first input coupled to an output of the first current reverse detector; and
a second input coupled to a first operation indication signal; and
a first IGBT comprising:
a control electrode coupled to an output of the first IGBT driver;
a first current electrode coupled to an input of a motor; and
a second current electrode coupled to a first voltage supply and to the first current reverse detector, wherein the first current reverse detector detects a first current direction by comparing a first voltage with a reference voltage, the first voltage being relative to a voltage across the first and second current electrodes of the first IGBT;
a first diode having a cathode coupled to the second current electrode of the first IGBT and an anode coupled to the first current electrode of the first IGBT; and
a second diode having a cathode coupled to the second current electrode of the first IGBT and an anode connected to the first input of the first comparator logic of the first current reverse detector to provide a current direction indication to the first IGBT driver from the first current reverse detector, and the anode not connected to the first current electrode of the first IGBT; and
a low-side driver comprising:
a second current reverse detector;
a second insulated gate bipolar transistor ("IGBT") driver comprising:
a first input coupled to an output of the second current reverse detector; and
a second input coupled to a second operation indication signal; and
a second IGBT comprising:
a control electrode coupled to an output of the second IGBT driver;
a first current electrode coupled to the input of a motor; and
a second current electrode coupled to a second voltage supply and to the second current reverse detector, wherein the second current reverse detector detects a second current direction by comparing a second voltage with the reference voltage, the second voltage being relative to a voltage across the first and second current electrodes of the second IGBT.

9. The driver circuit of claim 8, further comprising a third diode coupled between the current electrodes of the second IGBT.

10. The driver circuit of claim 8, wherein the first current electrode of the first IGBT is characterized as an emitter and the second current electrode of the first IGBT is characterized as a collector, and wherein the first current electrode of the second IGBT is characterized as a collector and the second current electrode of the second IGBT is characterized as an emitter.

11. The driver circuit of claim 8, wherein the low-side driver further comprises a fourth diode having a cathode coupled to the second current electrode of the second IGBT and an anode coupled to an input of the second current reverse detector.

12. The driver circuit of claim 8, wherein the first current reverse detector comprises:
a comparator comprising:
a first input coupled to a third voltage source and to the second current electrode of the first IGBT; and
a second input coupled to a reference voltage source, the reference voltage source providing the reference voltage; and
a flip-flop comprising:
a first input coupled to an output of the comparator;
a second input coupled to the first operation indication signal; and
an output coupled to the output of the current reverse detector.

13. The driver circuit of claim 8, wherein the second current reverse detector comprises:
a comparator comprising:
a first input coupled to a third voltage source and to the second current electrode of the second IGBT; and
a second input coupled to a reference voltage source, the reference voltage source providing the reference voltage; and
a flip-flop comprising:
a first input coupled to an output of the comparator;
a second input coupled to the second operation indication signal; and
an output coupled to the output of the second current reverse detector.

14. The driver circuit of claim 8, wherein the first and second current reverse detectors each comprise:
a comparator comprising:
a first input coupled to a third voltage source and to the second current electrode of the first and second IGBT; and
a second input coupled to a reference voltage source, the reference voltage source providing the reference voltage; and
a flip-flop comprising:
a first input coupled to an output of the comparator;
a second input coupled to a logic circuit operable to provide a logic level associated with the operation indication signal; and
an output coupled to the output of the current reverse detector.

15. The driver circuit of claim 14, wherein the logic circuit comprises an exclusive NOR gate comprising: a first input coupled to the operation indication signal; and a second input coupled to a complementary input signal.

16. The driver circuit of claim 14, wherein each current reverse detector further comprises a resistive element coupled between the first input of the comparator and the third voltage source.

* * * * *